United States Patent
Flynn

(10) Patent No.: US 7,808,273 B2
(45) Date of Patent: Oct. 5, 2010

(54) REDUCING LEAKAGE POWER IN LOW POWER MODE

(75) Inventor: David Walter Flynn, Cambridge (GB)

(73) Assignee: ARM Limited, Cambridge (GB)

( * ) Notice: Subject to any disclaimer, the term of this patent is extended or adjusted under 35 U.S.C. 154(b) by 27 days.

(21) Appl. No.: 12/071,388

(22) Filed: Feb. 20, 2008

(65) Prior Publication Data

US 2009/0051388 A1    Feb. 26, 2009

(30) Foreign Application Priority Data

Mar. 28, 2007   (GB) ................................. 0706049.4

(51) Int. Cl.
*G06F 7/38* (2006.01)
(52) U.S. Cl. .................... 326/46; 327/201; 365/227; 365/229; 713/320; 326/40
(58) Field of Classification Search ................ 326/46, 326/40; 713/320; 327/199–226; 365/226–229
See application file for complete search history.

(56) References Cited

U.S. PATENT DOCUMENTS

| | | | | |
|---|---|---|---|---|
| 6,247,134 B1 * | 6/2001 | Sproch et al. | ............... | 713/320 |
| 6,271,700 B1 * | 8/2001 | Itaya | ........................... | 327/202 |
| 6,310,491 B1 * | 10/2001 | Ogawa | ........................ | 326/46 |
| 6,320,418 B1 * | 11/2001 | Fujii et al. | .................... | 326/93 |
| 6,822,481 B1 * | 11/2004 | Srikantam et al. | ............. | 326/93 |
| 7,065,665 B2 * | 6/2006 | Jacobson et al. | ............ | 713/400 |
| 7,109,749 B2 * | 9/2006 | Khanna et al. | ................ | 326/40 |
| 7,237,164 B1 * | 6/2007 | Katchmart | ................... | 714/726 |
| 7,372,290 B2 * | 5/2008 | Fruhauf et al. | ................. | 326/8 |
| 7,516,425 B2 * | 4/2009 | Su et al. | ........................ | 716/2 |
| 2002/0009012 A1 * | 1/2002 | Fujioka et al. | ............. | 365/227 |
| 2002/0116440 A1 * | 8/2002 | Cohn et al. | ................. | 709/105 |
| 2004/0194037 A1 | 9/2004 | Chen et al. | | |
| 2008/0195876 A1 * | 8/2008 | Priel et al. | .................. | 713/320 |

OTHER PUBLICATIONS

A. Abdollahi et al, "Leakage Current Reduction in CMOS VLSI Circuits by Input vector Control" IEEE Transactions on Very Large Scale Integration (VLSI) Systems, Feb. 2004, pp. 1-22.
J.P. Halter et al, "A Gate-Level Leakage Power Reduction Method for Ultra-Low-Power CMOS Circuits".

* cited by examiner

*Primary Examiner*—James H. Cho
*Assistant Examiner*—Jason Crawford
(74) *Attorney, Agent, or Firm*—Nixon & Vanderhye P.C.

(57) ABSTRACT

Sequential circuitry comprising a data input, a data output, a clock signal input and a clamp signal input is disclosed. The sequential circuitry is arranged to clock a data signal received at said data input into said sequential circuitry in response to a clock signal received at said clock signal input, and to output a data signal from said sequential circuitry at said data output in response to said clock signal. The sequential circuitry is responsive to a predetermined value at said clamp signal input to switch to a low power mode and to set said data output to a forced value, while retaining said sequential state within said circuitry, said forced value being selected to reduce leakage power from combinatorial circuitry arranged to receive said output data signal.

16 Claims, 8 Drawing Sheets

REDUCING LEAKAGE POWER IN LOW POWER MODE

BACKGROUND OF THE INVENTION

This application claims priority to UK Application No. 0706049.4 filed Mar. 28, 2007, the entire content of which is hereby incorporated by reference.

1. Field of the Invention

This invention relates to the field of data processing systems. More particularly, this invention relates to data processing systems having low leakage power modes of operation.

2. Description of the Prior Art

In many circuits, particularly those that run off remote power supplies such as batteries, it is important to keep the power consumption of the circuits low. As well as addressing the issue of operational circuit efficiency, attention is also being turned to reducing static power consumption, i.e. power loss due to leakage currents. Power savings can be achieved by providing a circuit with low power modes, or sleep modes. In some of these modes the power is turned off to the circuit so that no power is consumed. Although this is very power efficient there are issues with the state being lost and with the restoration of this state when the circuit is powered up. There are also low power modes where the system is simply halted and the clock is turned off. In such circumstances data is not lost. Often a system may go to a halted mode first where the clock is switched off and thus, the state of each circuit element is held at that value. Steps are then taken to store the state required in various retention latches prior to moving to a fully powered down state.

It has been found that leakage power in the halted mode is highly state dependent. However, the architectural or microarchitectural state at which a CPU (or any IP block for that matter) is halted is not controlled as such but is the state that the CPU is in at the point a wait-for interrupt or external hardware control signal is received.

For example, there may be a set of registers that are implemented as standard cells with standard cell logic between the register stages. This standard cell logic is combinatorial logic and can leak power, but this leakage power is dependent on the values output from the register cells (sequential logic). Thus, there is theoretically a set of state bits that would minimise the leakage of the combinatorial logic located between the sequential logic stages. However, loading up this specific set of vectors or scanning in the state bits to produce such a state is expensive in terms of energy and time.

"Efficient Algorithms for Identifying the Minimum Leakage States in CMOS Combinational Logic" by Chopra et al. Proceedings of the 17$^{th}$ International conference on VLSI Design, looks at power dissipation in CMOS circuitry during inactive periods, and at how this can vary with the input values at individual gates. It discloses algorithms that can be used to calculate a set of vectors to produce input values for which leakage is a minimum.

"Leakage Current Reduction in CMOS VLSI Circuits by Input Vector Control" by Abdollahi et al. IEEE Transactions on Very Large Scale Integration Systems, Vol 12m No 2, February 2004, pages 140-154 discloses shifting in a new set of external inputs and preselected internal signals into a circuit in response to a sleep signal to minimise power loss in sleep. These signals are input into the combinatorial logic and thus, may affect the data paths inside this logic.

It would be desirable to be able to reduce leakage power without interfering with the clocking paths or other critical paths of the circuitry and without spending too much power and time producing a desired state.

SUMMARY OF THE INVENTION

A first aspect of the present invention provides sequential circuitry comprising a data input, a data output, a clock signal input and a clamp signal input; said sequential circuitry being arranged to clock a data signal received at said data input into said circuitry in response to a clock signal received at said clock signal input, and to output a data signal from said sequential circuitry at said data output in response to said clock signal; and said sequential circuitry being responsive to a predetermined value at said clamp signal input to switch to a low power mode and to set said data output to a forced value while retaining said sequential state within said circuitry, said forced value being selected to reduce leakage power from combinatorial circuitry arranged to receive said output data signal.

The provision of an input to the sequential circuitry that allows the data output to be clamped to a forced value when a predetermined signal is applied to the clamp signal input enables the output value of the sequential circuitry to be clamped to a desired value in low power mode. Thus, without changing the value stored within the sequential circuitry preferred values can be output that reduce leakage power in the combinatorial circuitry fed by these values. This may be at the cost of performance and additional circuitry depending on the embodiment. Although such a cost may not be desirable in performance critical situations, it is however a valuable enhancement for low power circuits.

Furthermore, this is an effective way of reducing leakage power and one which does not interfere with the clocking circuit and does not affect any critical pathways. Furthermore, it is a simple matter to add an additional input to circuitry and thus, existing circuitry can be adapted to function in this mode.

The amendment to the circuitry also happens within the sequential circuitry and thus data paths in the combinatorial circuitry attached to it are not affected. These data paths may be critical data paths and thus, it is advantageous not to interfere with them.

Furthermore, the use of an additional input means that the data and clock lines are not affected.

It should be noted that sequential circuitry is circuitry which holds data and is clocked, so that data is clocked into the circuitry, is held there and is clocked out. Combinatorial circuitry is circuitry that is not clocked.

In some embodiments said sequential circuitry is arranged to not receive a clock signal at said clock signal input during said low power mode.

The sequential circuitry can operate in a halted mode wherein the clock signal is stopped. In this mode the state is not lost and thus, it is easy to recover from this mode, and power is saved as the clock is not running and state storage latches are not toggling. Forcing the output data signals to certain values during this mode enables the combinatorial circuitry receiving these values to reduce its leakage power. The leakage power of devices within combinatorial logic are very dependent upon input values and thus changing these values can significantly affect power losses. Furthermore, while the clock is turned off, the output data signals are not required as the circuitry is halted and thus, forced output values are acceptable at this time.

In some embodiments, said sequential circuitry comprises a memory or a register file.

The sequential circuitry can comprise a number of things, however it is particularly applicable to latches or registers where it is useful to retain a value within these devices, and where forcing a value at the output helps save power in the combinatorial circuitry attached to it.

Embodiments of the present invention are also applicable to more complex circuitry, such as a memory or a register file.

In some embodiments said sequential circuitry comprises a plurality of data inputs and a plurality of data outputs, said sequential circuitry being arranged in response to said predetermined value at said clamp signal input to clamp said plurality of data outputs to a plurality of values, said plurality of values being selected to reduce leakage power from combinatorial circuitry arranged to receive said output data signals during said low power mode.

Although embodiments of the present invention are applicable to sequential circuitry having a single data input and output it is particularly applicable to ones having a plurality of data inputs and outputs. In such circumstances, a plurality of values can be forced onto the data outputs. They can be selected to provide a low leakage power in dependence on the combinatorial circuitry that the sequential circuitry is connected to.

In some embodiments, said plurality of data outputs are each forced to a low value, while in other embodiments they are each forced to a high value.

It may be that a particular selection of data outputs provides for an optimal leakage power. However, the leakage power may be improved by simply selecting all the outputs to be either high or low. This can be the case, where the system is not only halted but the power is also turned off too, so that a "sleep mode" is entered. On entering a sleep mode the power rails reach the same value which may be either a one or zero. In such a case, the optimal leakage power set up would be with data outputs being either all ones or all zeros.

In some embodiments, said sequential circuitry comprises at least one gate arranged between a data store within said sequential circuitry and said data output, said at least one gate being operable to receive a value stored in said data store at one input and to receive said clamped signal input at another input and operable to output said stored value in response to said clamped signal input not having a predetermined value and to output said forced value in response to said clamped signal input having said predetermined value.

It may be that circuitry such as gates are used to produce the desired outputs from the sequential circuitry. This provides an additional cost in performance and area for the circuitry, however, this can be an acceptable price to pay for the power saving advantages gained.

In other embodiments the sequential circuitry comprises a data store operable to store a data vector, the sequential circuitry being operable to output the data vector at the plurality of data outputs in response to the predetermined value at the clamp signal input.

Another way of achieving the desired outputs in response to the clamp signal is to provide a data vector which may be stored in a data store or may be hard wired into the circuitry. This data vector can be output at the data outputs in response to the predetermined value at the clamp input. This can be done in a number of ways such as via a multiplexer.

In some embodiments said sequential circuitry comprises a retention register or latch circuit having a retention circuit and a functional path latch circuit, said retention circuit being arranged to receive and retain a data signal from said functional path latch circuit in response to a changing edge of a retention signal, and to output said data signal to said functional path latch circuit in response to a different changing edge of said retention signal, said retention signal being received at said clamp signal input.

Although embodiments of the present invention involve applying an additional input to existing circuitry such that the clamp signal input can be input to the circuitry, in some embodiments it may be that there is already an input on existing circuitry that can be used for this purpose. In particular, a retention register or latch circuit may have a retention signal which triggers the data in the functional path to be stored in the retention latch in response to an edge of the clock signal. In such a circumstance, the data will be sent to the retention latch when entering sleep mode, which is when the output is desired to be clamped to a forced value. Thus, this input can be used as a clamp signal input and a forced data output and low leakage power can be achieved in such a circuit without adding any area to the actual data retention latch or register.

In some embodiments, said sequential circuitry comprises complementary data outputs, said sequential circuitry being operable to clamp a same output value at said complementary data outputs in response to said predetermined value at said clamp signal input.

Some sequential circuitry may comprise two complementary data outputs, for example this is common in latches. These circuits always output opposite values at these complementary data outputs when in functional use. However, this is not necessary when the circuit is not in a functional mode but in a halted or powered down mode. Thus, where appropriate these data outputs can output the same data value where such outputs would result in lower leakage power in combinatorial logic attached to the circuit.

In some embodiments said sequential circuitry comprises at least one sleep signal input, said sequential circuitry being arranged to turn said clock signal off and to clamp said data output to said forced value in response to receipt of a first sleep signal.

Forcing the data output to a required value is as has been explained particularly useful in a halted mode or in a power down mode. Thus, where such modes are activated by sleep signals these sleep signals can be used to trigger the forced value onto the data output. It can be that as in the retention case the same input used for the sleep signal is used as the clamping signal input.

A further aspect of the present invention provides a cell library comprising at least two cells, a first cell comprising sequential circuitry according to a first aspect of the present invention, wherein said data output forced value is a high value and a second cell comprising sequential circuitry according to a first aspect of the present invention, wherein said data output forced value is a low value, said first and second cells having a same footprint.

Embodiments of this invention are particularly useful for cell libraries. In such cases, circuitry is provided in a cell that can be selected for a particular design. When building a circuit where it is desired to reduce leakage power, the desired circuit can be formed of different cells, the actual cells being selected to provide the desired data outputs. These desired values are calculated from an analysis of the combinatorial logic that they are attached to. When this has been determined, then the appropriate circuitry from the cell library can be selected. Thus, there can be in this example two potential cells in the cell library, one giving a high value as the forced data output and one giving a low value. A combination of these can be selected to provide the appropriate circuitry. As they have the same footprint they are interchangeable with each other and this makes the design very simple. Furthermore, they can be designed to have the same footprint as previous cells that have the same function but do not have the forced data value output provision. Thus, existing designs can have their leakage power improved by using these cells.

A still further aspect of the present invention provides a cell library comprising four cells, each cell comprising sequential circuitry according to the first aspect of the present invention, said four cells each having two complementary data outputs, a first cell having a forced value that is high for said output and complementary output, a second cell having a forced value that is low for said output and complementary output, a third cell having a forced value that is low for said output and high for said complementary output, and a fourth cell having a forced value that is high for said output and low for said complementary output, wherein said four cells have a same footprint.

In the case that there are two complementary outputs for each cell then clearly there are four different possible forced values and thus, a cell library can select from each of the four possible cells when building the desired circuitry with the desired forced data value outputs that provide the low leakage conditions required. In alternative embodiments it may be advantageous to just provide two cells, each providing complementary forced outputs at the complementary outputs. The latter alternative would be less invasive on area and timing, but would not provide the leakage power savings of the former.

A yet further aspect of the present invention provides a cell library comprising a plurality of macro cells, each macro cells comprising circuitry according to a first aspect of the present invention, each of the macro cells comprising a different plurality of forced values at their plurality of outputs and each of the macro cells having a same footprint.

In addition to the relatively simple cell circuitry providing things such as registers or latches, macro cells can be used which have a plurality of data outputs. These can be, for example, memories or register files. They can be arranged to provide different forced values at their outputs and the desired ones can be selected. The arrangement of them in this way can be done in a number of ways. One way would be to input a data vector with the appropriate output into the macro cells. This can be hard wired in or it can be stored in data storage.

Another aspect of the present invention provides an integrated circuit comprising a plurality of circuit cells at least some of said circuit cells comprising sequential circuitry according to a first aspect of the present invention.

A yet still further aspect of the present invention provides a method of reducing leakage power during a halted state of a plurality of sequential circuitry cells each receiving and outputting data signals to combinatorial circuitry in response to a clock signal comprising: analysing said sequential circuitry cells and combinatorial circuitry to determine preferred data output signals that provide low leakage power in said combinatorial circuitry; providing said sequential circuitry cells with a clamp signal input; selecting a combination of said sequential circuitry cells that output said preferred data output signals in response to a predetermined value at their respective clamp signal inputs; providing said predetermined value at said clamp signal inputs of said combination of sequential circuitry cells during a halted state of said sequential circuitry cells; in response to receiving said predetermined value at said forcing signal inputs, outputting said preferred data output signals from said sequential circuitry cells.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
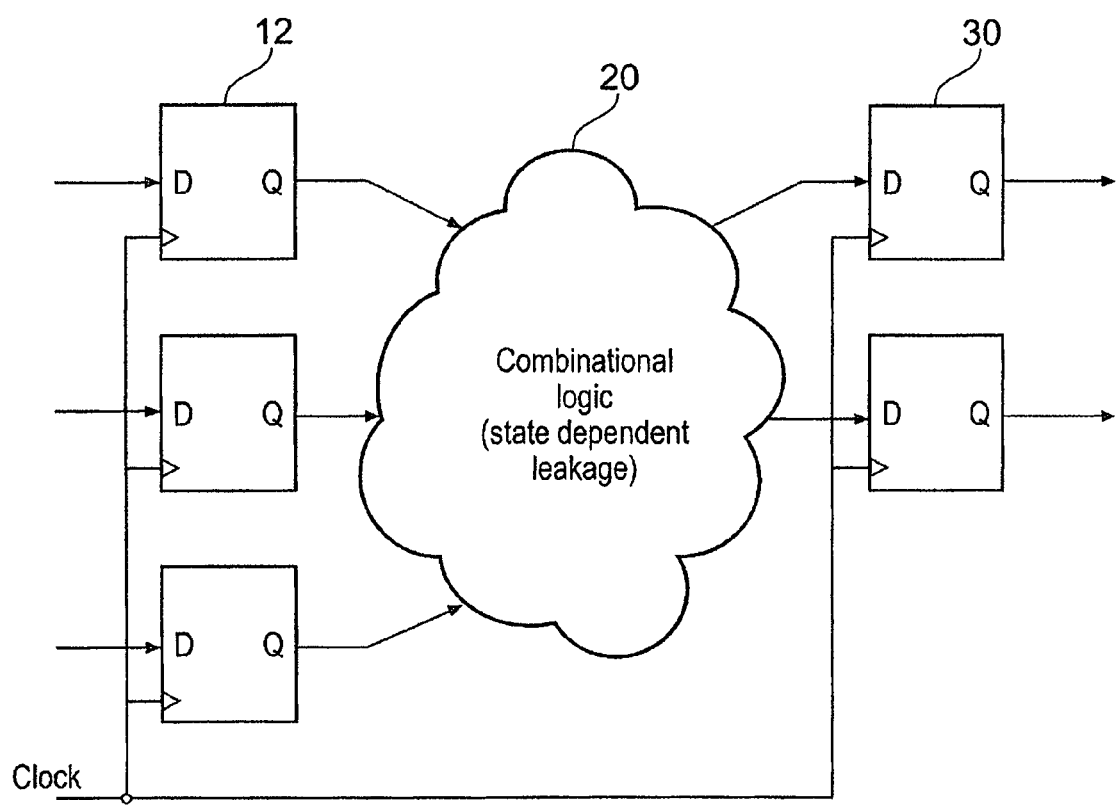
FIG. 1 schematically shows sequential and combinatorial circuitry according to the prior art.

FIG. 1 shows conventional sequential circuit cells which in this case are registers connected to further registers via combinatorial logic. Input data is received at register stage 12, is clocked through the registers and is output to combinatorial logic 20. Combinatorial logic combines the data inputs using a selection of gates and outputs data values to a further register stage 30. During a halted mode, where the register stages are not clocked and hold the state they have, the combinatorial logic will leak power. This leakage power will depend on the input signals at the gates within the logic 20 and thus, is dependent on the state output by register stage 12. However, such systems are conventionally stopped with arbitrary state in these registers in response to for example a signal from external hardware or a wait-for-interrupt signal.

Figure 2:
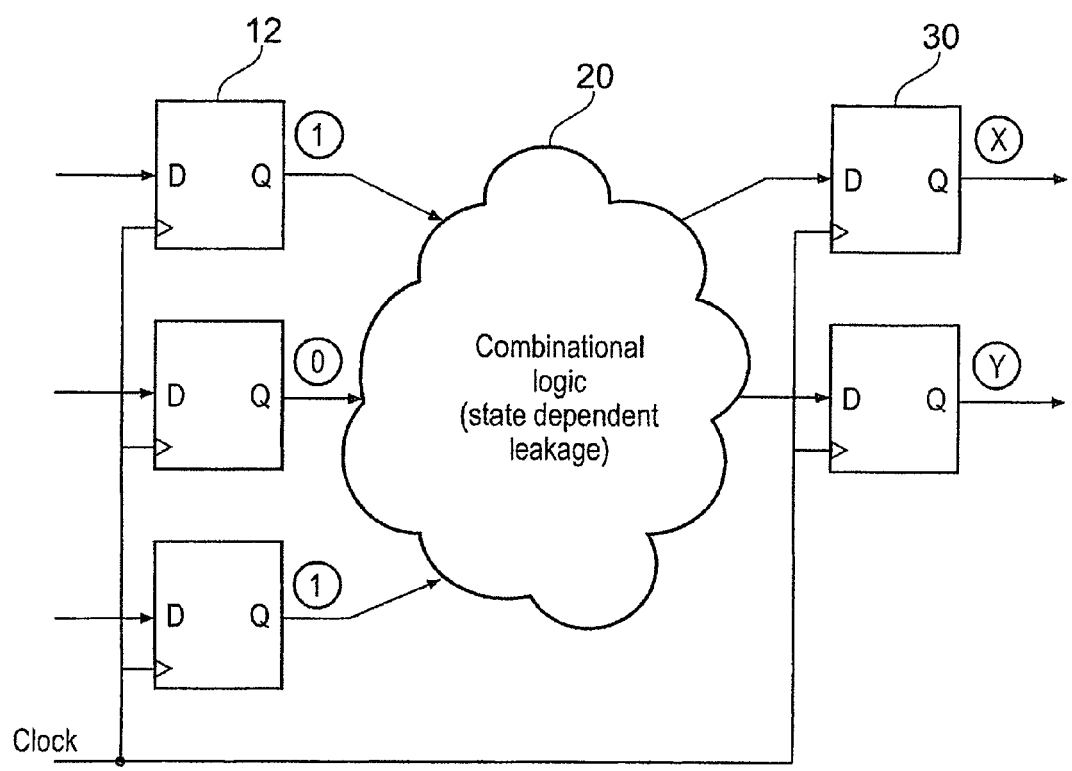
FIG. 2 schematically shows the sequential and combinatorial circuitry of FIG. 1 and the calculated preferential output states of the first sequential circuitry stage for reduced leakage power.

FIG. 2 shows the circuit of FIG. 1 in which an analysis has been performed to determine what the preferred outputs at the data outputs of registers 12 are to produce the minimal leakage power from combinatorial logic 20. It is found in this example that outputs of 1, 0 and 1 are the preferred outputs. Although, for simplicity and clarity reasons only three registers are shown clearly such an analysis can be performed on a much larger bank of registers.

Figure 3:
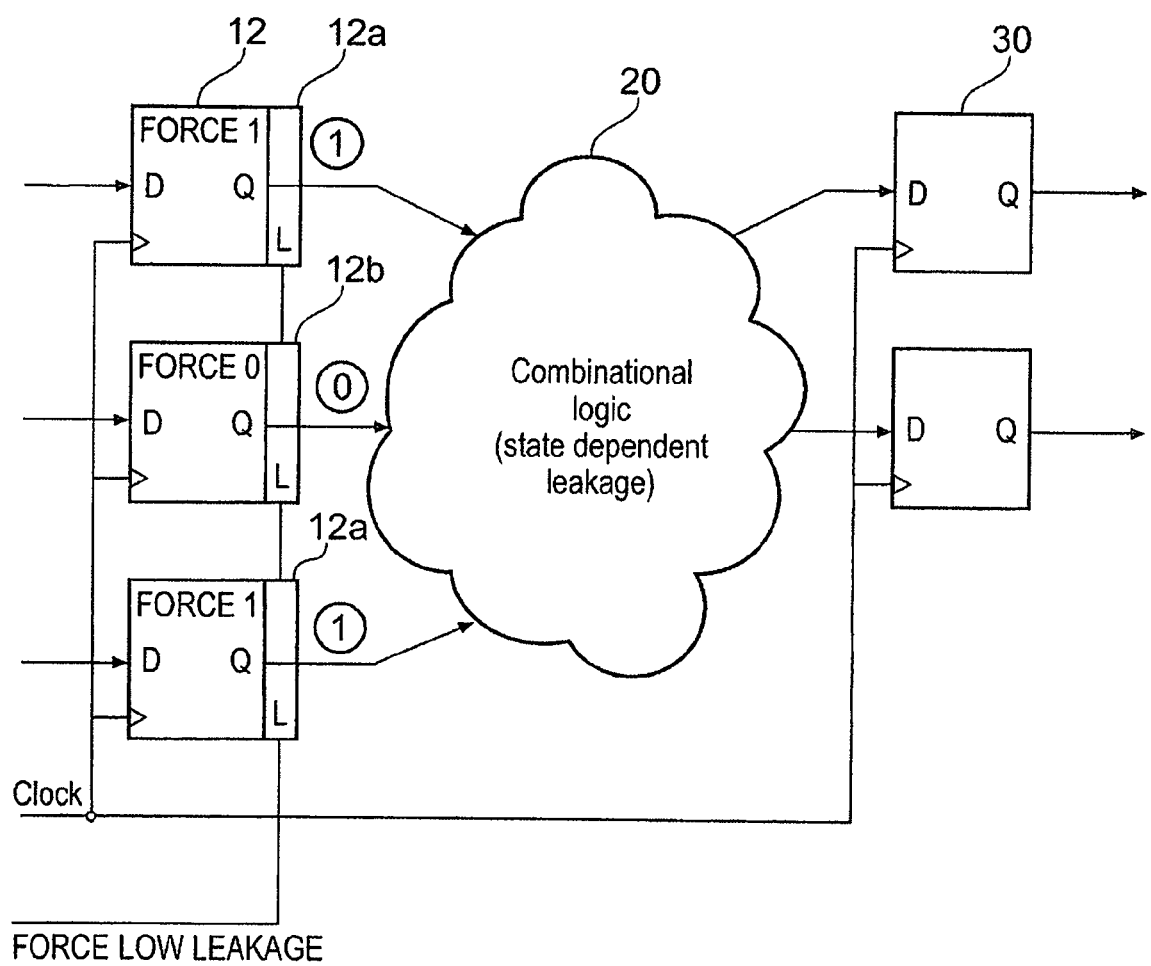
FIG. 3 schematically shows sequential and combinatorial circuitry according to an embodiment of the present invention.

FIG. 3 shows a similar circuit according to an embodiment of the present invention. In this system, the individual registers in register stage 12 have been adapted to have an additional input which is a force low leakage input. These registers have been formed such that when there is a predetermined value on the force low leakage input then the output of registers 12 are forced to a particular value. In this case, the first register is forced to a one the second to a zero and the third to a one.

An analysis of the circuitry was performed and it was determined that the state dependent leakage of the combinatorial logic 20 was lowest when the output of the registers 12 was 101.

These registers are formed from circuit cells from a cell library. There are two versions of these cells in the cell library and they are footprint compatible with each other in that they take up the same area and can each be used interchangeably. One of these cells 12a is arranged to give a high value on the output in response to the force low leakage signal and the other 12b is arranged to give a low value on the output in response to the force low leakage signal. Thus, having analysed the system the appropriate cells from the cell library can be selected and the appropriate system with a low leakage power can be built. Furthermore, these cells can be made to be footprint compatible with conventional registers, such that they can be used in systems that were designed to use conventional registers to produce an improved system with a lower leakage power.

Figure 4A:
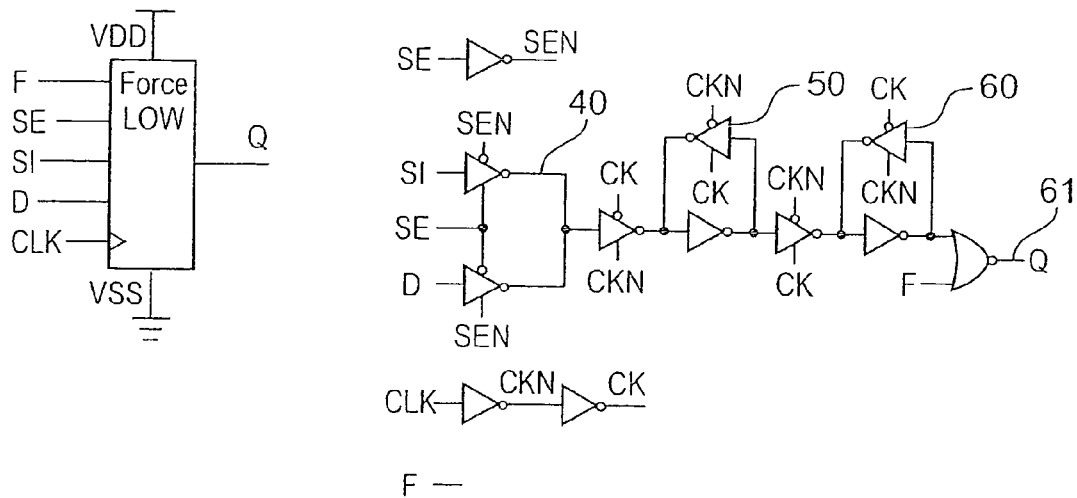
FIGS. 4a and 4b show master/slave latches according to an embodiment of the present invention.

FIG. 4a shows a master slave latch with a scan path according to an embodiment of the present invention. This latch has a data input and a scan input which are input via multiplexer 40 the appropriate input being selected in response to the scan enable or SE input of this multiplexer. The input is then sent to master latch 50 and then on to slave latch 60. In a conventional slave latch there is an inverter in the data path just before the output. In the slave latch 60 according to an embodiment of the present invention this inverter has been changed to NOR gate 61. There is an additional input into which a force or clamp signal input F is provided. When this signal F is asserted it clamps the output to a zero, when it is not asserted the output outputs the inverted value of the data input as it did in the conventional latch.

Figure 4B:
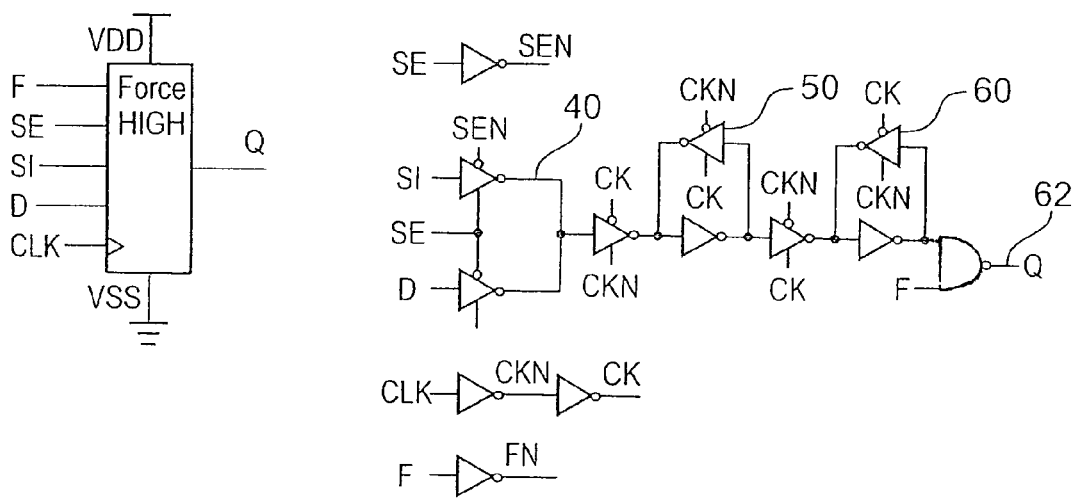

If it is desired for the output to be clamped high rather than low then the gating arrangement of FIG. 4b can be used in which a NAND gate 62 is provided at the output, and the force signal F is a 0 to force the output high, and a one to output the inverted value of the data input as in the conventional latch.

An alternative to the gating might be to use positive logic to produce the forcing function.

Figure 5:
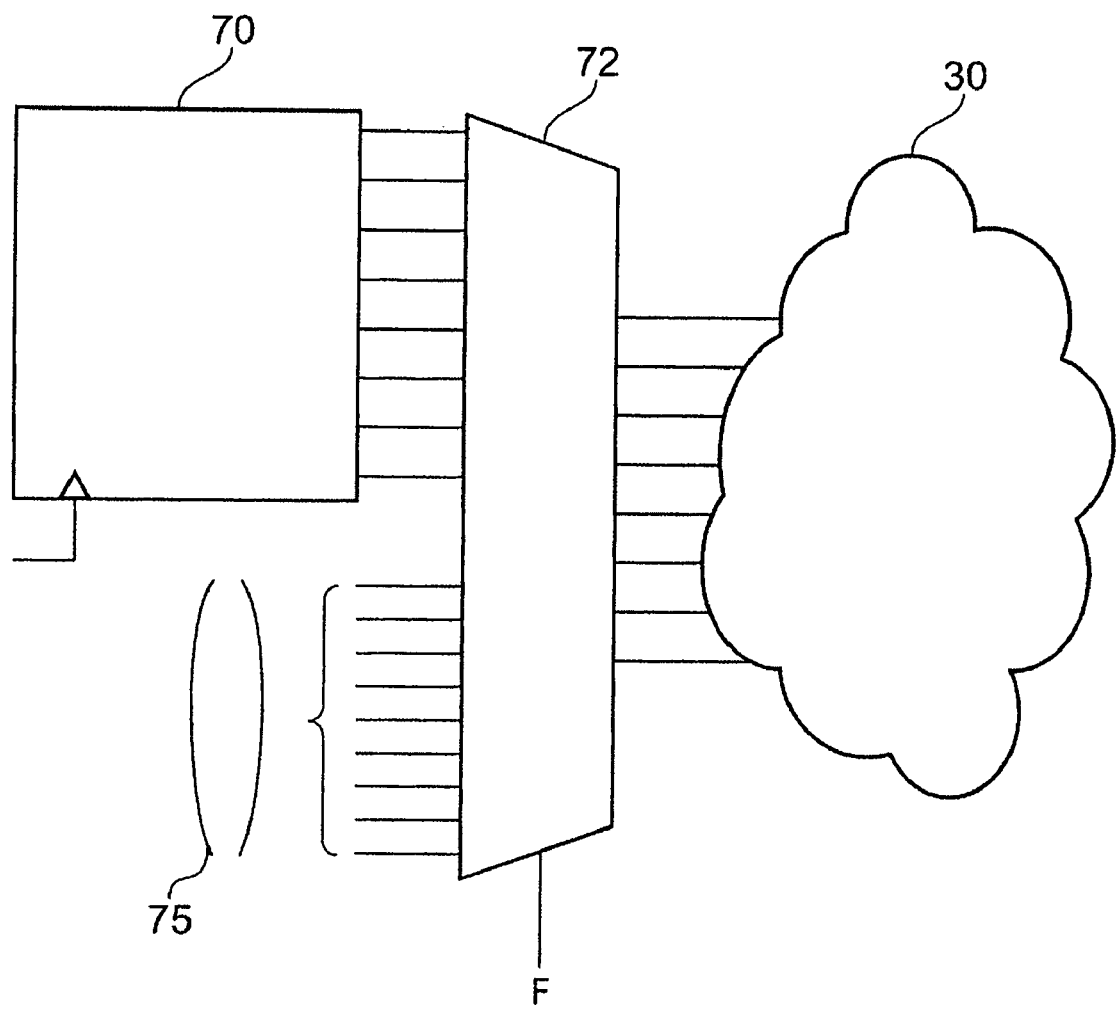
FIG. 5 shows a memory according to an embodiment of the present invention.

FIG. 5 shows an alternative embodiment of the present invention in which a memory 70 outputs a plurality of values to combinatorial logic 30. In this embodiment a clamping signal or forcing signal F is applied to a multiplexer 72. The multiplexer has in addition to the outputs of the memory as its inputs a data vector 75. This can be hard wired into the circuitry or it can be stored in a data store. This vector comprises the preferred outputs that it has been determined will produce a lower leakage power state for combinatorial logic 30. Thus, when a sleep mode such as a halted mode where the clock is stopped is entered, clamp input signal F is asserted and the multiplexer then selects data vector 75 rather than the output of the memory 70. In normal functional mode it is the output of the memory 70 that is input to the combinatorial logic 30.

Figure 6:
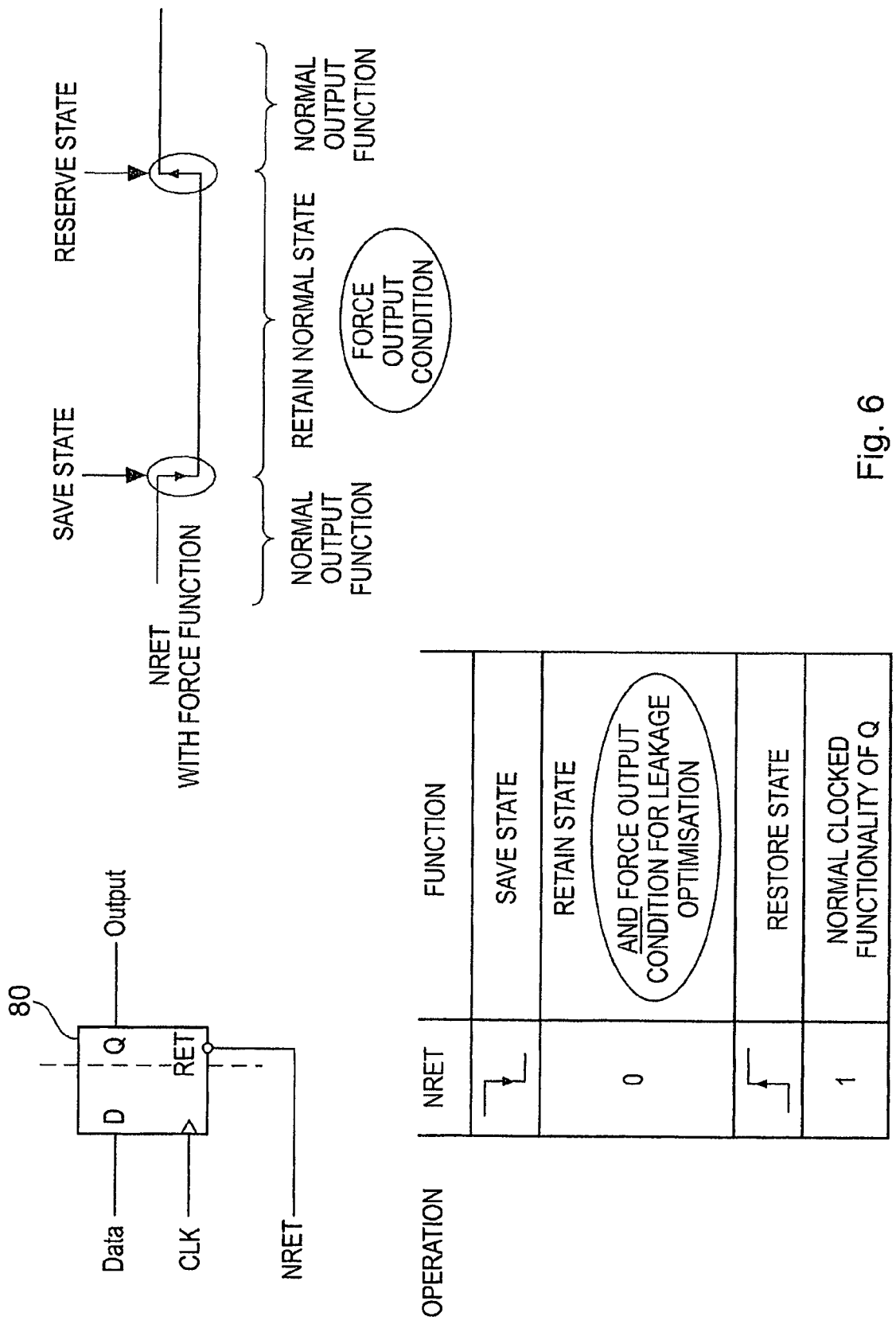
FIG. 6 shows a retention register according to an embodiment of the present invention.

FIG. 6 shows a retention register according to an embodiment of the present invention. Retention register 80 comprises a retention input NRET. This NRET input triggers the register to retain state in a retention portion of it prior to it being powered down. The saving of this state is edge triggered. Thus, in this particular example when NRET goes low it triggers the register to save state to a balloon latch for example. Then while NRET remains low the state is retained in this latch and the register can be turned off. The low value of NRET also acts as the forcing or clamping signal and thus, in response to NRET being low, the output Q is clamped to output a predetermined value.

When this NRET signal goes high this is the trigger to restore the state of the latch and at this point the output is no longer clamped to the low power value but can once again output the required data.

This operation is shown schematically in the table of FIG. 6.

Figure 7:
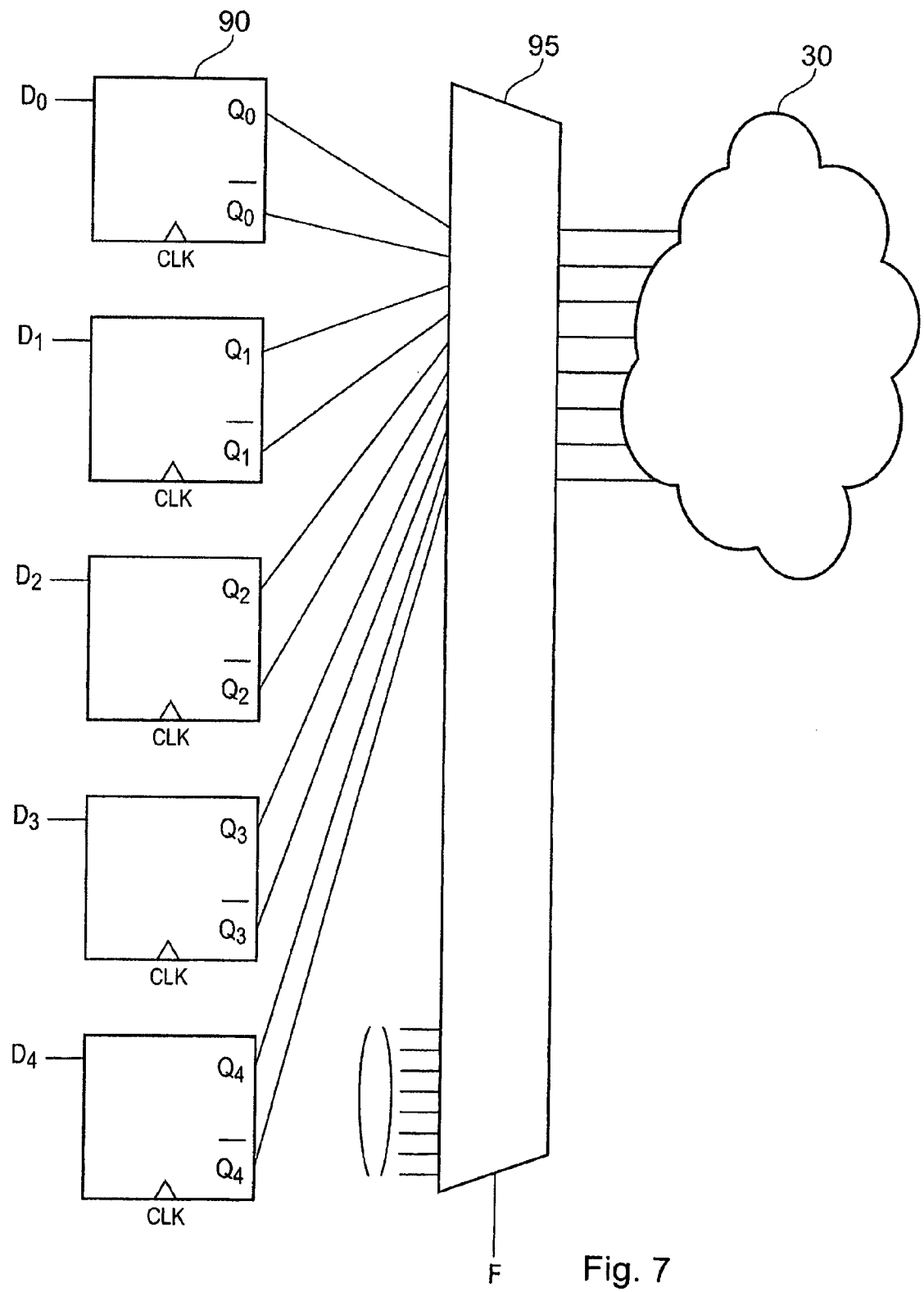
FIG. 7 shows a plurality of registers with complementary outputs connected to combinatorial logic according to an embodiment of the present invention.

FIG. 7 shows an alternative embodiment of the present invention where a bank of registers 90 having complementary output feed combinatorial logic 30. In this embodiment, a multiplexer 95 is used to select a desired data output vector to output to the combinatorial logic in response to a clamping signal F. This data output vector is dependent on the logic 30 and is calculated to provide a state that produces low leakage power in this combinatorial logic 30. In an alternative embodiment, rather than providing a multiplexer and data vector suitable latches with complementary outputs could be selected from a cell library that has four different types with four different clamped output values. Thus, when the required data vector is known it can be produced by selecting the appropriate cells from the cell library.

Figure 8:
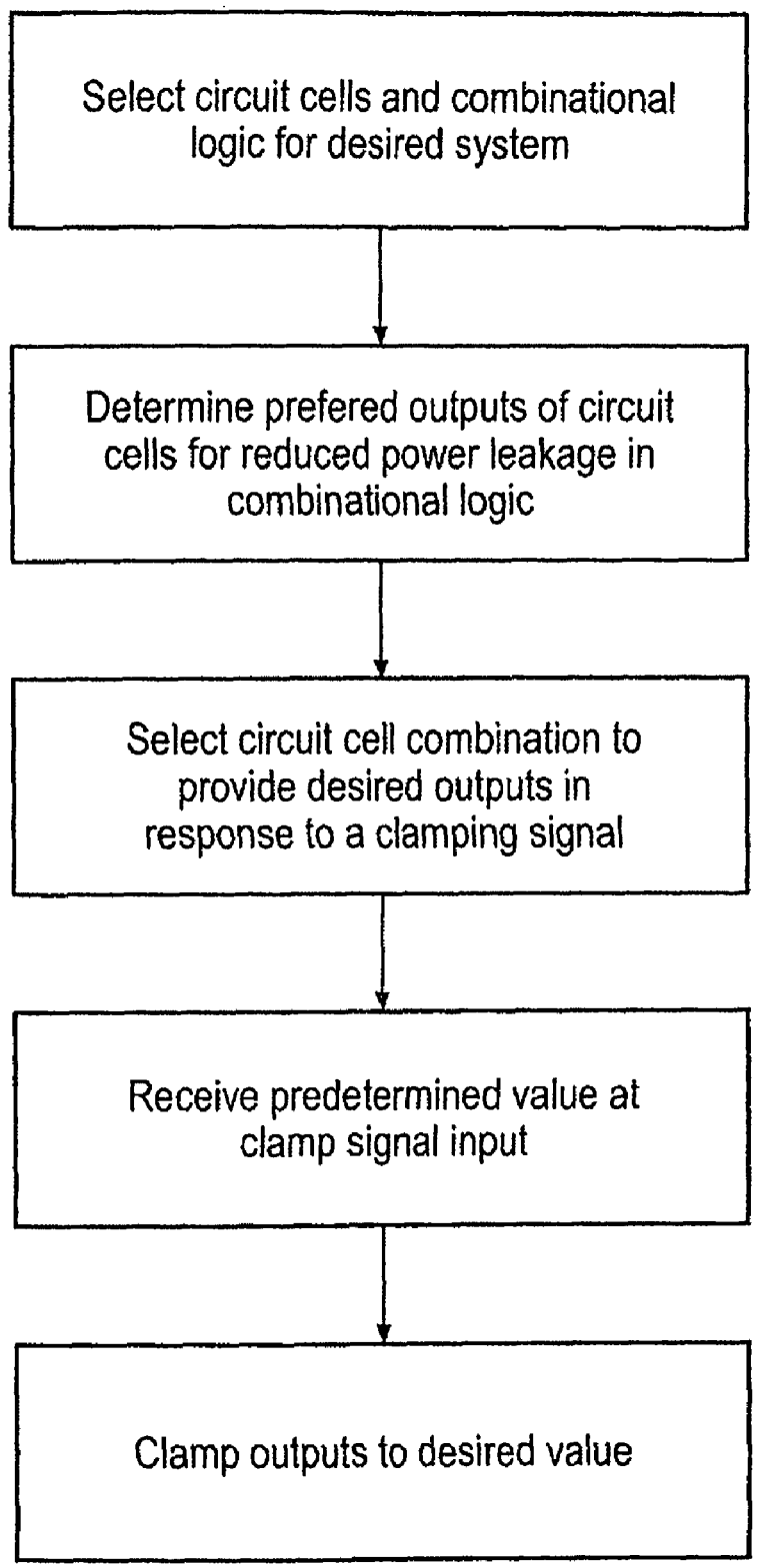
FIG. 8 shows a flow diagram illustrating the steps of a method according to an embodiment of the present invention.

FIG. 8 is a flow diagram illustrating the selection of such cells according to an embodiment of the present invention. Initially circuit cells and combinatorial logic required for a desired system are selected.

This system is then analysed and it is determined what the preferred output of the circuit cells for reduced leakage power in the combinatorial logic would be.

Once this has been determined the appropriate circuit cells are selected from the circuit cell library to provide these desired outputs in response to a clamping signal.

The system can then be built and in response to receiving a predetermined value at the clamp signal input the outputs can be clamped to the desired value.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Sequential circuitry comprising a data input, a data output, a clock signal input and a clamp signal input;
    said sequential circuitry, arranged to clock a data signal received at said data input into said sequential circuitry in response to a clock signal received at said clock signal input, to output a data signal from said sequential circuitry at said data output in response to said clock signal; and
    said sequential circuitry responsive to a predetermined value at said clamp signal input to switch to a low power mode and to set said data output to a forced value while retaining said sequential state within said circuitry, said forced value being selected to reduce leakage power from combinatorial circuitry arranged to receive said output data signal, wherein said sequential circuitry comprises:
    a retention circuit; and
    a functional path latch circuit, said retention circuit arranged to receive and retain a data signal from said functional path latch circuit in response to a changing edge of a retention signal, and to output said data signal to said functional path latch circuit in response to a different changing edge of said retention signal, said retention signal being received at said clamp signal input.

2. Sequential circuitry according to claim 1, wherein said sequential circuitry is arranged to not receive a clock signal at said clock signal input during said low power mode.

3. Sequential circuitry according to claim 1, wherein said sequential circuitry comprises at least one of a latch and a register.

4. Sequential circuitry according to claim 1, wherein said sequential circuitry comprises a memory or a register file.

5. Sequential circuitry according to claim 1, wherein said sequential circuitry comprises a plurality of data inputs and a plurality of data outputs, said sequential circuitry being arranged in response to said predetermined value at said clamp signal input to clamp said plurality of data outputs to a plurality of values, said plurality of values being selected to reduce leakage power from combinatorial circuitry arranged to receive said plurality of data output values.

6. Sequential circuitry according to claim 5, wherein said plurality of data outputs are each clamped to a low value.

7. Sequential circuitry according to claim 5, wherein said plurality of data outputs are each clamped to a high value.

8. Sequential circuitry according to claim 5, said sequential circuitry comprising at least one gate arranged between a data store within said sequential circuitry and said data output, said at least one gate being operable to receive a value stored in said data store at one input and to receive said clamped signal input at another input and operable to output said stored value in response to said clamped signal input not having a predetermined value and to output said forced value in response to said clamped signal input having said predetermined value.

9. Sequential circuitry according to claim 5, comprising a data store operable to store a data vector, said sequential circuitry being operable to output said data vector at said plurality of data outputs in response to said predetermined value at said clamp signal input.

10. Sequential circuitry according to claim 1, wherein said sequential circuitry comprises one of a retention register and a latch circuit.

11. Sequential circuitry according to claim 1, wherein said sequential circuitry comprises complementary data outputs, said sequential circuitry being operable to clamp a same output value at said complementary data outputs in response to said predetermined value at said clamp signal input.

12. Sequential circuitry according to claim 1, wherein said sequential circuitry comprises at least one sleep signal input, said sequential circuitry being arranged to turn said clock signal off and to clamp said data output to said forced value in response to receipt of a first sleep signal.

13. A cell library comprising at least first and second cells, each cell comprising sequential circuitry according to claim 1, wherein in said first cell said data output forced value is a high value, and in said second cell said data output forced value is a low value, said first and second cells having a same footprint.

14. A cell library comprising four cells, each cell comprising sequential circuitry according to claim 1, said four cells each having two complementary data outputs, a first cell having a forced value that is high for said output and complementary output, a second cell having a forced value that is low for said output and complementary output, a third cell having a forced value that is low for said output and high for said complementary output, and a fourth cell having a forced value that is high for said output and low for said complementary output, wherein said four cells have a same footprint.

15. A cell library comprising a plurality of macrocells, each macrocell comprising circuitry according to claim 5, each of said macrocells comprising a different plurality of forced values at their plurality of outputs, and each of said macrocells having a same footprint.

16. An integrated circuit comprising a plurality of circuit cells, at least some of said circuit cells comprising sequential circuitry according to claim 1.

* * * * *